(12) United States Patent
Bergantz et al.

(10) Patent No.: US 12,014,944 B2
(45) Date of Patent: Jun. 18, 2024

(54) MAPPING OF A REPLACEMENT PARTS STORAGE CONTAINER

(71) Applicant: APPLIED MATERIALS, INC., Santa Clara, CA (US)

(72) Inventors: Nicholas Michael Bergantz, San Jose, CA (US); Jeffrey Hudgens, San Francisco, CA (US); Doug McAllister, San Ramon, CA (US); Helder Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/045,119

(22) Filed: Oct. 7, 2022

(65) Prior Publication Data
US 2023/0058606 A1 Feb. 23, 2023

Related U.S. Application Data

(62) Division of application No. 16/994,413, filed on Aug. 14, 2020, now Pat. No. 11,469,123.
(Continued)

(51) Int. Cl.
*H01L 21/67* (2006.01)
*H01L 21/673* (2006.01)

(52) U.S. Cl.
CPC .. *H01L 21/67265* (2013.01); *H01L 21/67356* (2013.01)

(58) Field of Classification Search
CPC ......... H01L 21/67265; H01L 21/67356; H01L 21/67778
See application file for complete search history.

(56) References Cited

U.S. PATENT DOCUMENTS 6,135,698 A * 10/2000 Bonora ............. H01L 21/67775
414/940
6,303,939 B1 * 10/2001 Chung ............. H01L 21/67265
414/935
(Continued)

FOREIGN PATENT DOCUMENTS

EP    1 137 052 B1   4/2008
JP    2004214462 A   7/2004
(Continued)

OTHER PUBLICATIONS

International Search Report and Written Opinion for International Application No. PCT/US2020/046855, dated Nov. 26, 2020, 10 pages.
(Continued)

*Primary Examiner* — Mohammed Shamsuzzaman
(74) *Attorney, Agent, or Firm* — Lowenstein Sandler LLP

(57) ABSTRACT

A system includes a factory interface, a load port connected to the factory interface, a container connected to the load port, and a controller connected to a robot arm of the factory interface. The controller determines that the container is configured to store replacement parts for a process chamber of the system and causes the robot arm to move according to a first mapping pattern to identify, using a detection system at a distal end of an end effector of the robot arm, positions in the container. Regions of the container that do not contain replacement parts are determined and the robot arm is moved according to a second mapping pattern to identify a position in the container of a wafer and/or an empty carrier for a replacement part. A mapping of positions of replacement parts and positions of the wafer and/or empty carrier is recorded in a storage medium.

20 Claims, 10 Drawing Sheets

Related U.S. Application Data

(60) Provisional application No. 62/888,931, filed on Aug. 19, 2019.

(56) References Cited

U.S. PATENT DOCUMENTS

| | | | | |
|---|---|---|---|---|
| 7,581,916 | B2* | 9/2009 | Miller | B82Y 35/00 |
| | | | | 414/217 |
| 9,799,542 | B2* | 10/2017 | Sugawara | H01L 21/68742 |
| 11,112,773 | B2* | 9/2021 | Trussell | H01L 21/67167 |
| 11,328,910 | B2* | 5/2022 | Sugawara | H01L 21/681 |
| 2003/0119214 | A1* | 6/2003 | Kitazawa | H01L 21/67265 |
| | | | | 438/5 |
| 2004/0213648 | A1* | 10/2004 | Hofmeister | H01L 21/67265 |
| | | | | 414/217 |
| 2004/0249507 | A1* | 12/2004 | Yoshida | H01L 21/67265 |
| | | | | 700/245 |
| 2005/0205209 | A1* | 9/2005 | Mosden | H01L 21/67069 |
| | | | | 156/345.31 |
| 2018/0068879 | A1* | 3/2018 | Wong | H01L 21/67196 |
| 2018/0151403 | A1* | 5/2018 | Smith | H01L 21/67766 |
| 2020/0405403 | A1* | 12/2020 | Shelton, IV | A61B 17/3421 |
| 2021/0407831 | A1* | 12/2021 | Sunugatov | H01L 21/6732 |

FOREIGN PATENT DOCUMENTS

| | | |
|---|---|---|
| JP | 2007227936 A | 9/2007 |
| JP | 2010206232 A | 9/2010 |
| JP | 2010219209 A | 9/2010 |
| JP | 2012216614 A | 11/2012 |
| JP | 2015153809 A | 8/2015 |
| JP | 2017098540 A | 6/2017 |
| JP | 2018010992 A | 1/2018 |
| WO | 2000022589 A1 | 4/2000 |

OTHER PUBLICATIONS

Taiwan Search report of Taiwan Application No. 109128223 dated Apr. 27, 2022.

* cited by examiner

800

Determine whether a container is configured to store replacement parts for a process chamber 810

Cause the robot arm to move according to a first mapping pattern to identify positions in the container 820

Determine regions of the container that do not contain replacement parts 830

Cause the robot arm to move according to a second mapping pattern to identify a position in the container of a wafer or a replacement part 840

Record a mapping of positions of replacement parts, an empty carrier, or the wafer 850

FIG. 8

MAPPING OF A REPLACEMENT PARTS STORAGE CONTAINER

RELATED APPLICATIONS

The present application is a continuation of U.S. patent application Ser. No. 16/994,413 filed on Aug. 14, 2020, which claims the benefit under 35 U.S.C. § 119(e) of U.S. Provisional Patent Application No. 62/888,931, filed Aug. 19, 2019, which is incorporated herein, in its entirety, by this reference.

TECHNICAL FIELD

Embodiments of the present disclosure relate, in general, to methods and systems for detecting and mapping a state of a replacement parts storage container.

BACKGROUND

An electronics processing system may include one or more load ports for receiving storage containers such as front opening unified pods (FOUPs) that store substrates (e.g., wafers). In order to determine slots in the FOUPs that contain substrates and slots that do not contain substrates, a mapping routine may be performed. However, if the FOUP contains objects other than substrates, then a collision may occur, which may damage a robot arm, the FOUP and/or an object in the FOUP.

SUMMARY

Some of the embodiments described cover a method including receiving, at a load port of a factory interface of an electronics processing system, a container configured to store replacement parts for a process chamber of the electronics processing system. The method further includes moving a robot arm according to a first mapping pattern to identify positions of one or more replacement parts in the container. The robot arm identifies the positions using a detection system at a distal end of an end effector of the robot arm. The detection system includes an emitting component and a sensing component. The detection system detects an object responsive to a beam directed from the emitting component to the sensing component being broken by the object. The method further includes determining regions of the container that do not contain replacement parts. The method further includes moving the robot arm according to a second mapping pattern to identify, within the regions of the container that do not contain replacement parts, a position in the container of at least one of a wafer or an empty carrier for a replacement part. The position is identified using the detection system at the distal end of the end effector. The method further includes recording, in a storage medium, a mapping of positions of the one or more replacement parts and of positions of at least one of the empty carrier or the wafer in the container.

In some embodiments, a method includes receiving, at a load port of a factory interface of an electronics processing system, a container configured to store replacement parts for a process chamber of the electronics processing system. The method further includes determining, using a detection system at a distal end of an end effector of a robot arm, whether the container is configured to store replacement process kit rings for the process chamber. The detection system includes an emitting component and a sensing component. The detection system detects an object responsive to a beam directed from the emitting component to the sensing component being broken by the object. The method further includes, in response to determining that the container is configured to store replacement process kit rings, performing a first container mapping recipe. The first container mapping recipe includes: moving the robot arm according to a first mapping pattern to identify, using the detection system at the distal end of the end effector, positions of one or more replacement process kit rings in the container; determining regions of the container that do not contain the replacement process kit rings; moving the robot arm according to a second mapping pattern to identify, using the detection system at the distal end of the end effector, a position in the container of at least one of a wafer or an empty carrier for a process kit ring; and recording, in a storage medium, a mapping of positions of replacement process kit rings and of positions of at least one of the empty carrier or the wafer in the container.

In some embodiments, an electronics processing system includes a factory interface including a robot arm. The robot arm includes a detection system at a distal end of an end effector of the robot arm. The detection system includes an emitting component and a sensing component. The detection system detects an object responsive to a beam directed from the emitting component to the sensing component being broken by the object. The electronics processing system further includes a load port connected to the factory interface. The electronics processing system further includes a container connected to the load port. The electronics processing system further includes a controller operatively connected to the robot arm. The controller is to determine whether the container is configured to store replacement parts for a process chamber of the electronics processing system. The controller is further to subsequently cause the robot arm to move according to a first mapping pattern to identify, using the detection system at the distal end of the end effector of the robot arm, positions in the container. The controller is further to determine regions of the container that do not contain replacement parts. The controller is further to cause the robot arm to move according to a second mapping pattern to identify, using the detection system at the distal end of the end effector, a position in the container of at least one of a wafer or an empty carrier for a replacement part. The controller is further to record, in a storage medium, a mapping of positions of replacement parts and of positions of at least one of the empty carrier or the wafer in the container.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 8 is a flow chart of another method for detecting positions of replacement parts, wafers, or empty carriers for a replacement part stored at a replacement parts storage container, according to aspects of the present disclosure.

DETAILED DESCRIPTION OF EMBODIMENTS

Figure 1:
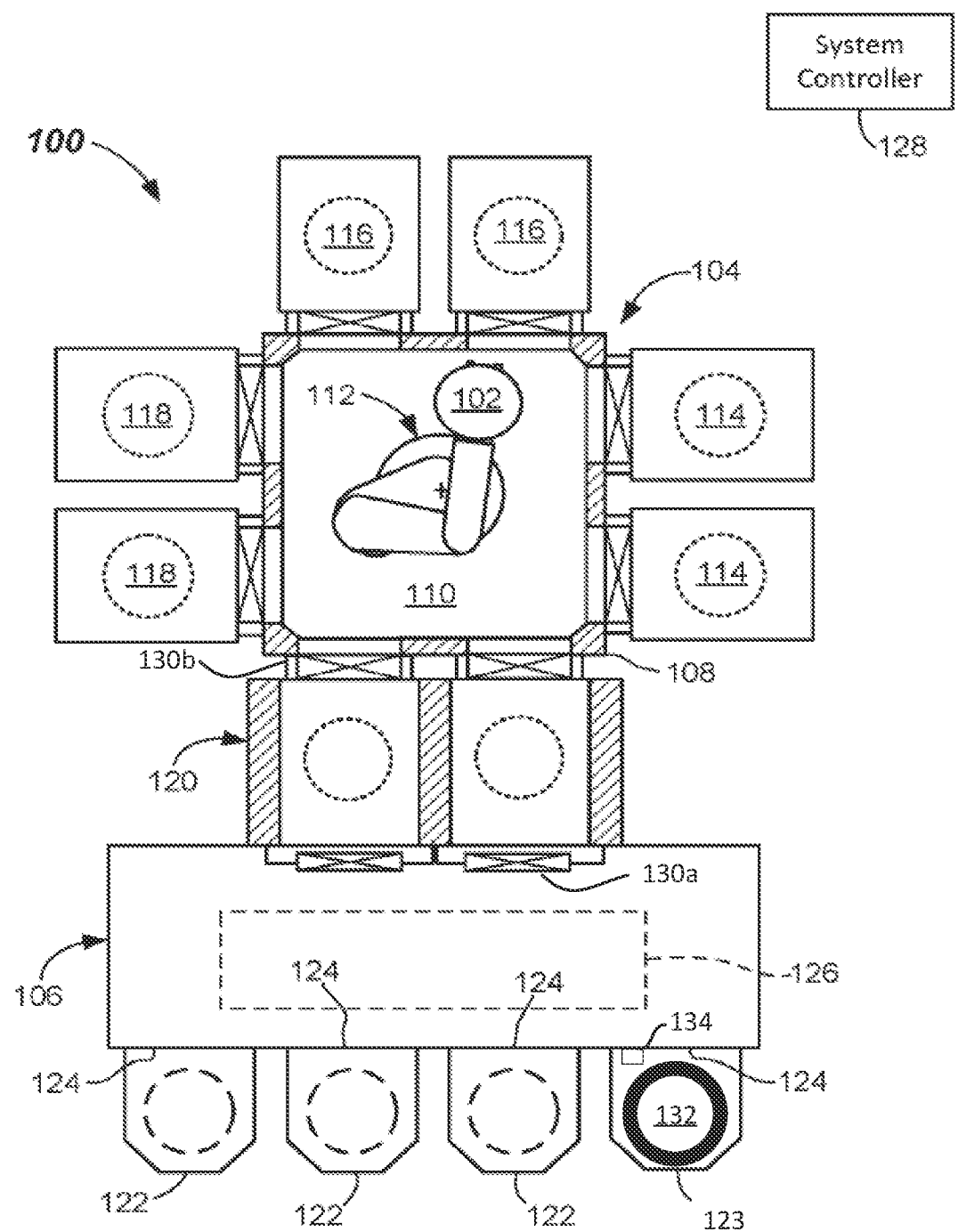
FIG. 1 is a top schematic view of an example electronics processing system, according to aspects of the present disclosure.

Embodiments described herein are related to methods and systems for detecting and mapping an object stored in a replacement parts storage container. A replacement parts storage container may store one or more replacement parts to replace used parts of one or more stations at an electronics processing system. In some embodiments, the replacement parts storage container may be a process kit ring enclosure system where one or more replacement process kit rings (also referred to as edge rings) are stored. Replacement process kit rings may replace used process kit rings at a processing chamber of the electronics processing system. In some embodiments, a replacement part may be disposed on a replacement part carrier. For example, a process kit ring stored at the process kit ring enclosure system may be disposed on a process kit ring carrier. An empty replacement part carrier (i.e., a replacement part carrier without a replacement part) may also be stored at the process kit ring enclosure system. Additional objects may also be stored at the replacement parts storage container. For example, a placement validation wafer (i.e., a wafer with a camera, a wafer with a light reflection detector, etc.) can be stored in a process kit ring enclosure system.

Each object stored in the replacement parts storage container may be stored in a section (i.e., a slot) of the replacement parts storage container. Each slot of the replacement parts storage container may be defined by one or more sets of support fins configured to support each object in the replacement parts storage container. Objects stored in the replacement parts storage container may be retrieved from the replacement parts storage container by an end effector of a robot arm. The end effector may be configured to pick up and handle specific objects, such as wafers, process kit rings, and/or process kit ring carriers.

Occasionally, one or more objects may be improperly stored at the replacement parts storage container. For example, an object may be cross-slotted between two slots of the replacement parts storage container (i.e., a first portion of the object is placed on a first set of support fins of a first slot and a second portion of the object is placed on a second set of support fins of a second slot). In another example, two or more objects may be double-slotted at a slot of the replacement parts storage container (i.e., a first object is placed directly on top of a second object so that two objects are located in a single slot). One or more objects may also be improperly stored at the replacement parts storage container if a first type of object is stored at a slot designated for a second type of object (e.g., a replacement part is stored at a slot designated for a replacement part carrier).

The methods and systems disclosed herein use a detection system at a distal end of the end effector to detect positions of one or more objects stored at the replacement parts storage container. The detection system may include an emitting component (e.g., a laser emitter, a LED emitter, etc.) and a sensing component (also referred to herein as a sensor). The detection system may detect an object in response to a beam (e.g., a laser beam) directed from the emitting component to the sensor being broken by the object. The replacement parts storage container may be received at a load port of a factory interface of an electronics processing system. A robot arm of a factory interface robot may move according to a first mapping pattern to identify positions of one or more replacement parts in the replacement parts storage container. One or more slots of the replacement parts storage container that do not contain replacement parts may be determined. The robot arm may additionally move according to a second mapping pattern to identify, within one or more of the slots that do not contain replacement parts, a position of either a wafer or an empty replacement part carrier. In response to determining one or more slots that contain replacement parts and one or more slots that contain either a wafer or an empty replacement part carrier, a mapping of positions of multiple different types of objects the slots may be generated and recorded in a storage medium. Stored information about the positions may include a slot number containing the object, a minimum and maximum height of the object, an amount that the object projects from the interior of the container, an indicator of the type of object, and so on.

In alternative or additional embodiments, the detection system may be used to detect one or more objects in the replacement parts storage container that are stored improperly. A top portion and a bottom portion of an object in a slot may be identified. A location of the top portion and a location of the bottom portion may be measured. An appropriate thickness of the object may be determined based on a difference between the location (e.g., vertical location or height) of the top portion and the location (e.g., vertical location or height) of the bottom portion of the object. Based on the approximate thickness of the object, a type of the object (e.g., replacement part, replacement part carrier, wafer, etc.) may be determined. In response to determining that determined approximate thickness does not correspond to any of a replacement part, a replacement part carrier, or a wafer, it may be determined that the object is stored incorrectly in the replacement parts storage container.

Conventionally, load ports receive FOUPs that contain substrates. However, as described in embodiments, containers (e.g., FOUPs) that store replacement parts may also be connected to a load port. A standard mapping routine may be used to detect the positions of substrates in a conventional FOUP. However, running such a standard mapping routine on a container that holds replacement parts may result in damage of the end effector, the container, and/or objects stored in the container. Embodiments provide a flexible mapping routine that avoids damage that would otherwise be caused by running a standard mapping routine configured to detect the positions of substrates (which have a uniform size).

By detecting the positions of one or more objects in the replacement parts storage container, as described in embodiments herein, a likelihood that the end effector and/or the object to be retrieved by the end effector will be damaged decreases, as the end effector is more likely to successfully retrieve the object from the slot. By increasing the likelihood that the end effector will successfully retrieve each object, a number of damaged objects will be significantly reduced, thereby reducing costs associated with operation of the electronics processing system. Additionally, the amount of time that it takes to properly retrieve replacement parts from the replacement parts storage container may be reduced in embodiments by increasing the likelihood that the correct replacement part is properly retrieved. As a result, an overall system latency may be decreased.

FIG. 1 is a top schematic view of an example electronics processing system 100, according to aspects of the present disclosure. Electronics processing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Electronics processing system 100 may include a process tool 104 and a factory interface 106 coupled to process tool 104. Process tool 104 may include a housing 108 having a transfer chamber 110 therein. Transfer chamber 110 may include one or more processing chambers (also referred to as process chambers) 114, 116, 118 disposed therearound and coupled thereto. Processing chambers 114, 116, 118 may be coupled to transfer chamber 110 through respective ports, such as slit valves or the like.

Processing chambers 114, 116, 118 may be adapted to carry out any number of processes on substrates 102. A same or different substrate process may take place in each processing chamber 114, 116, 118. A substrate process may include atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 114, an etching process may be performed in one or both of process chambers 116, and an annealing process may be performed in one or both of process chambers 118. Other processes may be carried out on substrates therein. Processing chambers 114, 116, 118 may each include a substrate support assembly. The substrate support assembly may be configured to hold a substrate in place while a substrate process is performed.

As described above, an etching process may be performed at one or more processing chambers 114, 116, 118. As such, some processing chambers 114, 116, 118 (such as etch chambers) may include edge rings (also referred to as process kit rings) 132 that are placed at a surface of the substrate support assembly. In some embodiments, the process kit rings may occasionally undergo replacement. While replacement of process kit rings in conventional system includes disassembly of a processing chamber 114, 116, 118 by an operator to replace the process kit ring, electronics processing system 100 may be configured to facilitate replacement of process kit rings without disassembly of a processing chamber 114, 116, 118 by an operator.

Transfer chamber 110 may also include a transfer chamber robot 112. Transfer chamber robot 112 may include one or multiple arms where each arm includes one or more end effectors at the end of each arm. The end effector may be configured to handle particular objects, such as wafers. Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

A load lock 120 may also be coupled to housing 108 and transfer chamber 110. Load lock 120 may be configured to interface with, and be coupled to, transfer chamber 110 on one side and factory interface 106. Load lock 120 may have an environmentally-controlled atmosphere that may be changed from a vacuum environment (wherein substrates may be transferred to and from transfer chamber 110) to an at or near atmospheric-pressure inert-gas environment (wherein substrates may be transferred to and from factory interface 106) in some embodiments. In some embodiments, load lock 120 may be a stacked load lock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, load lock 120 may be configured to perform a substrate process (e.g., an etch or a pre-clean) on one or more substrates 102 received therein.

Factory interface 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers (also referred to as containers) 122 and load lock 120. In other and/or similar embodiments, factory interface 106 may be configured to receive replacement parts from replacement parts storage containers 123. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings. In some embodiments, factory interface robot 126 may include multiple end effectors. In such an embodiment, one or more of the end effectors may be configured to pick up and handle a specific type of object. For example, a first end effector may be configured and/or optimized for picking up and handling a process kit ring, and a second end effector may be configured and/or optimized for picking up and handling wafers.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 may be maintained at a vacuum level. Electronics processing system 100 may include one or more vacuum ports that are coupled to one or more stations of electronics processing system 100. For example, first vacuum ports 130a may couple factory interface 106 to load locks 120. Second vacuum ports 130b may be coupled to load locks 120 and disposed between load locks 120 and transfer chamber 110.

Electronics processing system 100 may also include a system controller 128. System controller 128 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit (CPU), or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 128 may include a data storage device (e.g., one or more disk drives and/or solid state drives), a main memory, a static memory, a network interface, and/or other components.

System controller 128 may execute instructions to perform any one or more of the methodologies and/or embodiments described herein. The instructions may be stored on a computer readable storage medium, which may include the main memory, static memory, secondary storage and/or processing device (during execution of the instructions). In one embodiment, the instructions include a mapping recipe that may be executed to map the contents of a replacement parts storage container. The processing device of system controller 128 may execute the instructions to control factory interface robot 126 and map the contents of the replacement parts storage container. The processing device of system controller 128 may also execute the instructions to control factory interface robot 126 to map the contents of conventional FOUPs that store substrates. In embodiments, execution of the instructions by system controller 128 causes system controller to perform the methods of one or more of FIGS. 6-8. System controller 128 may also be configured to permit entry and display of data, operating commands, and the like by a human operator.

FIG. 1 schematically illustrates transfer an edge ring (or other process kit ring) 132 that may be transferred into a processing chamber 114, 116, 118. According to one aspect of the disclosure, an edge ring 132 is removed from a replacement parts storage container 123 (e.g., a process kit ring enclosure system or FOUP) via factory interface robot 126 located in the factory interface 106. Edge rings are discussed herein, but it should be understood that embodiments described with reference to edge rings also apply to other process kit rings and to other replaceable parts or components of processing chambers other than process kit rings. Replacement parts storage container 123 may be configured to store at least one of edge rings, edge ring carriers, or wafers (e.g., placement validation wafers). A replacement parts storage container 123 may be distinguished from substrate carrier 122 and/or other types of replacement parts storage containers based on a registration identifier 134 in embodiments. In other or similar embodiments, replacement parts storage container 123 may be distinguished from substrate carrier 122 based on one or more external features associated with replacement parts storage container 123. Further details regarding detecting that replacement parts storage container 123 is a not a conventional substrate carrier 122 are discussed herein.

Figure 2:
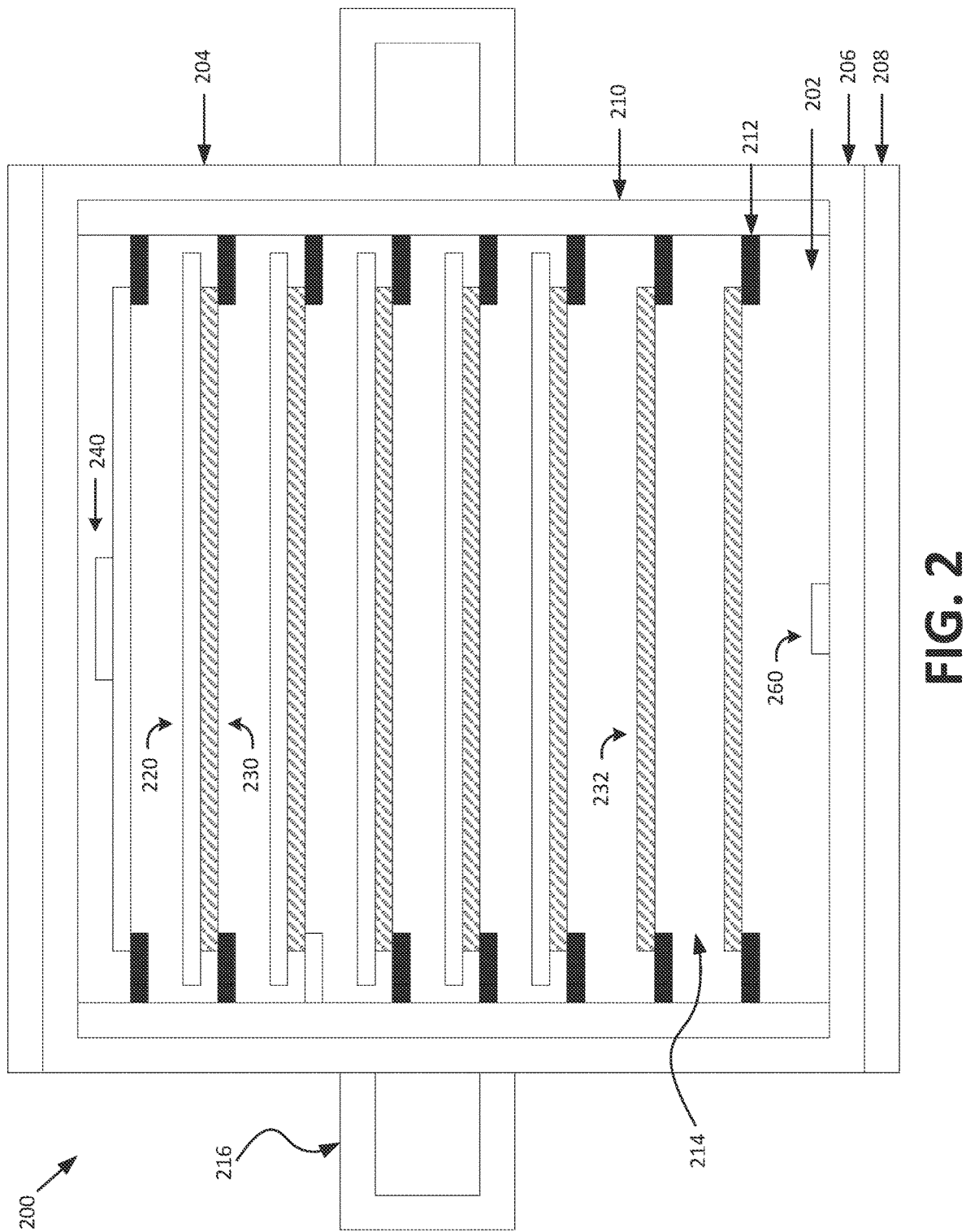
FIG. 2 illustrates a front view of an example replacement parts storage container, according to aspects of the present disclosure.

FIG. 2 illustrates a front view of an example replacement parts storage container 200, according to aspects of the present disclosure. The replacement parts storage container 200 may be used to securely hold process kit rings 220 and enable replacement of process kit rings 220 in a wafer processing system (e.g., electronics processing system 100 of FIG. 1).

The replacement parts storage container 200 includes surfaces to at least partially enclose an interior volume 202 of the replacement parts storage container 200. The surfaces of the replacement parts storage container 200 that enclose the interior volume 202 may include one or more of sidewalls 204, a bottom surface 206, a base plate 208, a top cover 201, a door frame (not shown), and a door (not shown). The door may be removed from the replacement parts storage container 200 to expose a front interface of the process kit enclosure system 200 to interface the replacement parts storage container 200 with a load port of a wafer processing system (e.g., see processing system 100 of FIG. 1). The replacement parts storage container 200 may meet one or more FOUP standards (e.g., size, weight, interface, handle clearance, etc.). For example, the replacement parts storage container 200 may interface with the same load port of a wafer processing system as a substrate FOUP. The replacement parts storage container 200 may meet one or more of the semiconductor equipment and materials international (SEMI) standards (e.g., use FOUP door per SEMI E15.1, docks on load ports per SEMI 47.1, sits on kinematic pins per SEMI E57, etc.). The replacement parts storage container 200 may also meet one or more standards for fabrication automation (e.g., overhead transport (OHT) automation, automatic guided vehicle (AGV) automation, person guided vehicle (PGV automation, etc.), and may be managed by existing factory automation. For example, an external surface of an OHT-compatible replacement parts storage container 200 may include one or more features configured to engage with OHT automation components, such as a flange at a top surface (i.e., a roof surface) of the replacement parts storage container 200, one or more kinematic couplings at a bottom surface (i.e., a base surface) of the replacement parts storage container 200 configured to engage with one or more lift pins of an OHT automation component, and so forth. In another example, a size or shape of the replacement parts storage container 200 (e.g., the body of the replacement parts storage container 200 with handles at one or more external surfaces) may be compatible with OHT automation.

One or more support structures 210 may be included in the interior volume 202 of the replacement parts storage container 200. In some embodiments, two support structures 210 are disposed in the interior volume 202 to support one or more objects. In some embodiments, the support structures 210 are comb structures. The support structures 210 may be made of a plastic (e.g., polyethylene) and a strengthening material may be disposed within the support structures 210 (e.g., a carbon fiber fill, one or more vertical rods of strengthening material through the support structures, etc.). Each support structure 210 may include one or more fins 212 (e.g., approximately horizontal fins) to support each object.

Each object may be supported by two or more fins 212 that are approximately horizontal and approximately parallel to each other. Two or more fins 212 may define a slot 214 of the replacement parts storage container 200. The support structures 210 may support each object so that an end effector on a robot arm of the wafer processing system can be inserted below the object, lift the object, and retract the object from the replacement parts storage container 200.

The interior volume 202 of the replacement parts storage container 200 may include at least one process kit ring 220 (e.g., supported by corresponding fins 212 of support structures 210) for automated transfer into the wafer processing system. In some embodiments, a process kit ring 220 may have an expected thickness of between approximately 0.5 cm and approximately 3.0 cm. In some embodiments, a process kit ring 220 may have an approximate thickness of approximately 1.0 cm. A robot arm may remove the process kit ring 220 from the process kit enclosure system 200 for automated transfer to the process kit ring 220 to a process chamber of the wafer processing system. A robot arm may remove a used process kit ring from the process chamber for automated transfer into the process kit enclosure system 200.

A process kit ring 220 in the process kit enclosure system 200 may be secured to an upper surface of a process kit ring carrier 230. In some embodiments, a process kit ring carrier 230 may have an expected thickness of between approximately 2.0 mm to approximately 3.0 mm. In some embodiments, a process kit ring carrier 230 may have an expected thickness of approximately 2.5 mm. A robot arm may remove the process kit ring 242 from the process kit enclosure system 200 by inserting an end effector into the process kit enclosure system 200 below the process kit ring carrier 230, lifting the process kit ring carrier 230 and the process kit ring 220, and extracting the process kit ring carrier 230 with the process kit ring 220. The space between the fins 212 of support structure 210 may allow the end effector to enter and lift an object without contacting the fins 212.

As described herein, a process kit ring 220 on a process kit ring carrier 230 may refer to one or more process kit rings disposed on the process kit ring carrier 230. For example, the process kit ring 220 may include two or more of an edge ring, processing ring, support ring, sliding ring, quartz ring, and/or the like that are disposed on the process kit ring carrier 230.

In some embodiments, a process kit ring 220 may be disposed directly on the fins 212 and the robot arm may obtain a process kit ring carrier 230 (e.g., from within the wafer processing system) to lift the process kit ring 220. In some embodiments, the robot arm may lift the process kit ring 220 without use of a process kit ring carrier 230. One or more process kit rings 220 may be disposed on each process kit ring carrier 230. For example, two or three process kit rings 330 may be nested within each other (e.g., a first process kit ring of a first diameter, a second process kit ring of a second diameter sized to fit within the first process kit ring, and a third process kit ring of a third diameter sized to fit within the second process kit ring) on the process kit ring carrier 230.

A set of substantially parallel fins 212 of support structures 210 may support a placement validation wafer 240 (e.g., multi-function wafer). In some embodiments, the placement validation wafer 240 may be a similar size to wafers that are handled by the processing system. In some embodiments, a validation wafer 240 may have an expected thickness of between approximately 0.5 mm to approximately 12 mm. In some embodiments, a validation wafer 240 may have an expected thickness of approximately 0.8 mm, or between 0.5 mm and 1.5 mm. In some embodiments, a thickness of the placement validation wafer 240 may correspond to a thickness of a process kit ring and/or process kit ring carrier. For example, the thickness of placement validation wafer 240 may be between approximately 8 mm to approximately 10 mm. The placement validation wafer 240 may be located on a set of substantially parallel fins 212 to enable automated transfer of the placement validation wafer 240 into the wafer processing system to validate placement of process ring kits 220 in the wafer processing system. The fins 212 used to support the placement validation wafer 240 may have a different spacing and/or size than the fins used to support the process kit rings and/or process kit ring carriers.

As discussed above, each set of substantially parallel fins 212 may create a slot 214 to support an object. Each of one or more lower slots 214 (e.g., the lowest slots) of the replacement parts storage container 200 may support an empty process kit ring carrier 232. An upper slot 214 (e.g., the top slot) of the replacement parts storage container 200 may support the placement validation wafer 240. Each of one or more middle slots 214 (e.g., above the empty process kit ring carriers 232, below the placement validation wafer 240) may support process kit ring carriers 230 that support a process kit ring 220. One or more sets of substantially parallel fins 212 (e.g., slots for a process kit ring 220 on a process kit ring carrier 230) may include a corresponding process kit ring orientation bracket. Each process kit ring orientation bracket may have one or more protrusions (e.g., pins) that engage with a flat portion of the interior surface of the process kit ring 220 to constrain movement (e.g., rotation, movement in x- and y-directions, etc.) of the process kit ring 220. The one or more protrusions of the process kit ring orientation bracket and one or more features (e.g., pin contacts, recesses, etc.) of the process kit ring carrier 230 may constrain movement of the process kit ring 220.

In some embodiments, one or more objects may be improperly placed within a slot 214. For example, a first portion of an object may be supported by a first set of fins 212 of a first slot 214 and a second portion of the object may be supported by a second set of fins 212 of a second slot 214. The first slot may be an upper slot 214 of the process kit enclosure system 200 while the second slot may be a lower slot 214 of the process kit enclosure system 200. This may be referred to as cross-slotting. In some embodiments, a process kit ring 220 disposed on a process kit ring carrier 230 may be cross-slotted. In some embodiments, one or more objects of the process kit enclosure system 200 may be improperly placed on top of another object within a slot 214. This may be referred to as double-slotting.

As discussed above, one or more protrusions of one or more of a set of fins 212 be configured to engage with one or more features of a process kit ring carrier 220 to constrain movement of process kit ring 220. In some embodiments, the process kit ring carrier 220 may be improperly placed within a slot 214 such that the one or more pins of the process kit ring carrier 230 do not engage with the one or more protrusions of a set of fins 212. For example, the process kit ring carrier 220 may be placed at an improper orientation with respect to a set of fins 212 such that process kit ring carrier 220 is rotated form a target orientation by approximately 15°, preventing one or more pins of the process kit ring carrier 230 to not engage with the one or more protrusions. In such embodiments, the one or more pins that do not engage with the one or more protrusions may rest on another portion of one or more fins 212, causing the process kit ring carrier 220 to be placed at an angle within the slot 214.

The robot arm may remove an object (e.g., empty process kit ring carrier 232, process kit ring carrier 230 securing a process kit ring 220) from lower slots and place used objects in the vacated lower slots to avoid contamination from used objects (e.g., used process kit rings from the wafer processing system) falling on other objects (e.g., new process kit rings 220, placement validation wafer 240). For example, one or more robot arms may remove an empty process kit ring carrier 232 from the first slot, retrieve a used process kit ring using the empty process kit ring carrier 232, and replace the now full process kit ring carrier 230 and supported used process kit ring at the first slot. The robot arm(s) may then remove a new process kit ring 220 secured to a process kit ring carrier 220 from a third slot above the first and second slots, place the process kit ring 220 into a process chamber, and then replace the now empty process kit ring carrier 232 back in the third slot.

The process kit enclosure system 200 may include a registration feature 260 (e.g., coupled or integral to the bottom surface 206). The registration feature 260 may enable identification of the replacement parts storage container 200 as not being a wafer enclosure system (e.g., as not being a traditional FOUP carrying wafers). The registration feature 260 may enable identification of the process kit enclosure system 200 as a process kit enclosure system 200. In some embodiments, the registration feature 260 may enable identification of the specific process kit enclosure system 200 or the type of objects of the process kit enclosure system 200. For example, the registration feature 260 may indicate that the process kit enclosure system 200 is supporting process kit rings 220 disposed on process kit ring carriers 230. In some embodiments, the registration feature 260 is a simple tab, peg, protrusion, etc. In some embodiments, registration feature 260 may be configured to at a first position when a door of process kit enclosure system 200 is closed and a second position when the door of process kit enclosure system 200 is opened. For example, registration feature 260 may be stored at the first position when the door is closed and spring to the second position when the door is opened.

In some embodiments, system controller 128 may determine that process kit enclosure system 200 is not a traditional FOUP based on one or more external features of process kit enclosure system 200. For example, registration feature 260 may be disposed on an exterior surface of process kit enclosure system 200. For example, registration feature 260 may be a registration identifier (e.g., a registration number, a bar code, etc.) etched onto an exterior wall of process kit enclosure system 200. Registration feature 260 may be detected by an identifying component of electronic processing system 100 or external to electronic processing system 100. For example, registration feature 260 may be scanned by an identification device (e.g., a handheld identification device) prior to process kit enclosure system 200 interfacing with the load port of the wafer processing system.

System controller 128 may determine that process kit enclosure system 200 is not a traditional FOUP based on other external features associated with process kit enclosure system 200. For example, an exterior surface of process kit enclosure system 200 may include one or more structural features that are not included on an external surface of traditional FOUPs. Additionally or alternatively, an exterior surface of a traditional FOUP may include one or more structural features that are not included on an external surface of process kit enclosure system 200. An identifying component of electronics processing system 100 may identify the one or more structural features (or lack of the one or more structural features) on an external surface of process kit enclosure system 200, in accordance with previously described embodiments.

A factory interface robot may be configured to perform a mapping of objects in FOUPs to determine a presence and position of the objects in a FOUP. In some embodiments, the factory interface robot may be configured to perform the mapping in response to determining that an external surface process kit enclosure system 200 includes a structural feature that are not included on an external surface of traditional FOUPs or does not include a structural feature that is included on an external surface of traditional FOUPs. The robot arm may move an end effector to a first portion of the replacement parts storage container 200 to begin a mapping process. In some embodiments, the end effector may encounter the registration feature 260. The presence of the registration feature 260 may provide a signal that indicates to system controller 128 that a replacement parts storage container 200 is engaged to a load port rather than a traditional wafer-containing FOUP. In response to encountering the registration feature 260, the robot arm may perform the mapping in accordance with a first container mapping recipe. In response to not encountering the registration feature 260, the robot arm may perform the mapping in accordance with a second container mapping recipe. In some embodiments, in response to encountering the registration feature 260, the robot arm may terminate the mapping process.

Figure 3:
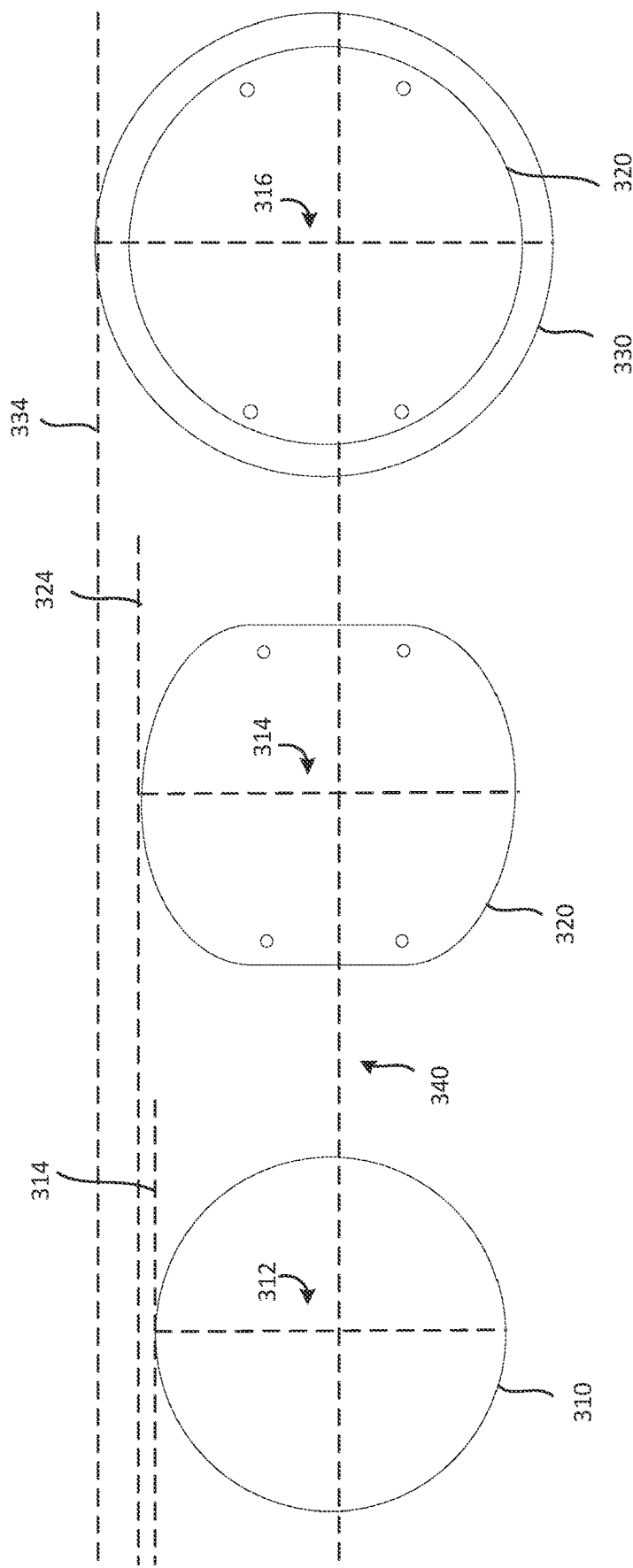
FIG. 3 illustrates a top view of a validation wafer, a process kit ring carrier, and a process kit ring disposed on a process kit ring carrier, according to aspects of the present disclosure.

FIG. 3 illustrates a top view of a validation wafer 310, a process kit ring carrier 320, and a process kit ring 330 disposed on a process kit ring carrier 320, according to aspects of the present disclosure. Validation wafer 310 may be associated with a first diameter 312, process kit ring carrier 320 may be associated with a second diameter 322, and process kit ring 330 may be associated with a third diameter 332. In some embodiments, first diameter 312, second diameter 322, and third diameter 332 may be equivalent. In other embodiments, first diameter 312, second diameter 322, and third diameter 332 may not be equivalent. For example, third diameter 332 may be larger than second diameter 322, and second diameter 322 may be larger than first diameter 312. As a result of first diameter 312, second diameter 322, and third diameter 332 not being equivalent, validation wafer 310, process kit ring carrier 320, and process kit ring 330, when positioned in a replacement parts storage container (e.g., at a center reference point 340), may extend to different portions of the replacement parts storage container (e.g., different horizontal distances from the center reference point 340). For example, validation wafer 310 may extend to a first distance to first point 314, process kit ring carrier 320 may extend a second distance to a second point 324, and process kit ring 330 disposed on process kit ring carrier 320 may extend a third distance to a third point 334. Diameters of each of the types of objects that may be stored in a replacement parts storage container may be known (e.g., may be stored in configuration data accessible by system controller 128). The various points (e.g., horizontal distances from the center point) at which objects are detected may be used to determine the type of objects that are detected. For example, responsive to system controller 128 detecting an object at the first point 314, system controller may determine based on the configuration data that the detected object is validation wafer 310. Responsive to detecting an object at the second point 324, system controller 128 may determine based on the configuration data that the detected object is an empty process kit ring carrier 320. Responsive to detecting an object at the third point 334, system controller 128 may determine based on the configuration data that the detected object is process kit ring 330.

Figure 4:
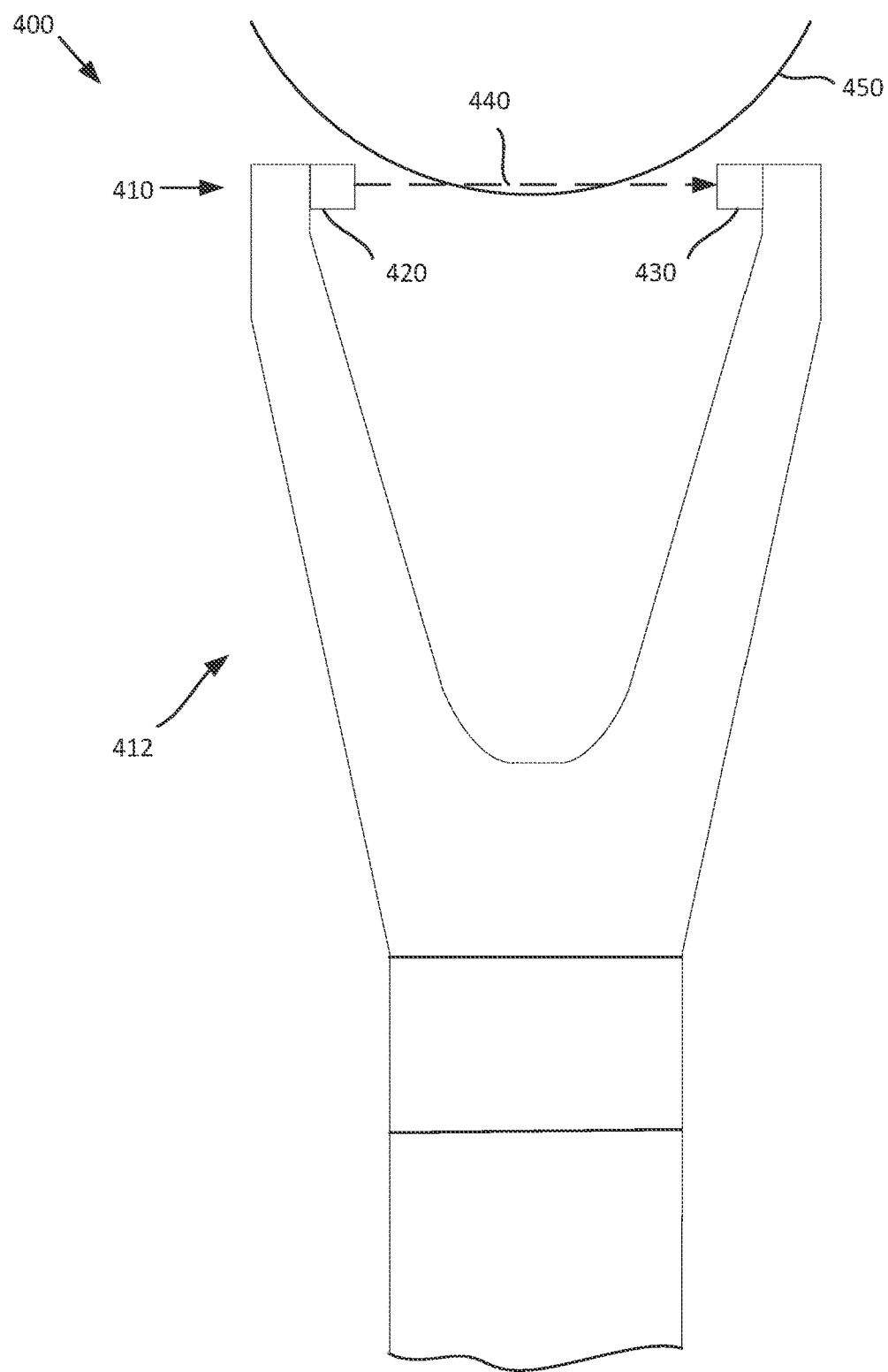
FIG. 4 illustrates a top view of a detection system at a distal end of an end effector of a robot arm, according to aspects of the present disclosure.

FIG. 4 illustrates a top view of a detection system 410 at a distal end of an end effector 400 of a robot arm, according to aspects of the present disclosure. In some embodiments, end effector 400 may include two or more blades 412. Each blade 412 may be configured to interact with a portion of an object 450 stored in a slot of a replacement parts storage container. A distal end of at least one blade 412 may include one or more components of detection system 410. Detection system 410 may include at least an emitting component 420 and a sensing component 430 (also referred to as sensor 430). In some embodiments, emitting component 420 may be a laser emitter or a LED emitter. Emitting component 420 may emit a beam 440 (e.g., a laser beam) directed at sensor 430. Detection system 410 may detect an object 450 in response to beam 440 being broken by object 450. Responsive to the beam 440 being broken, the sensor 430 may transmit a signal to system controller 128. System controller 128 may determine an x, y and z position of the end effector at the point at which the beam 440 was broken, and may store this information in storage.

In some embodiments end effector 400 of the robot arm may also include a z-direction encoder (referred to as a z-encoder) (not shown). A z-encoder may be configured to determine a location of end effector 400 at a particular position. In response to detection system 410 detecting an object 450, the z-encoder may detect a location of end effector 400 at the position at which object 450 was detected. The location of end effector 400 may be transmitted to a controller (e.g., system controller 128), where the location may be used to determine a section of a replacement parts storage container where object 450 is contained. In some embodiments, the z-encoder may be further configured to determine a first location of end effector 400 where beam 440 is first broken by object 450 and a second location of end effector 400 where beam 440 is detected by sensor 430. The first location and second location may be transmitted to system controller 128, which may use the received first and second location to determine an approximate thickness of an object at the section of the replacement parts storage container.

Figure 5A:
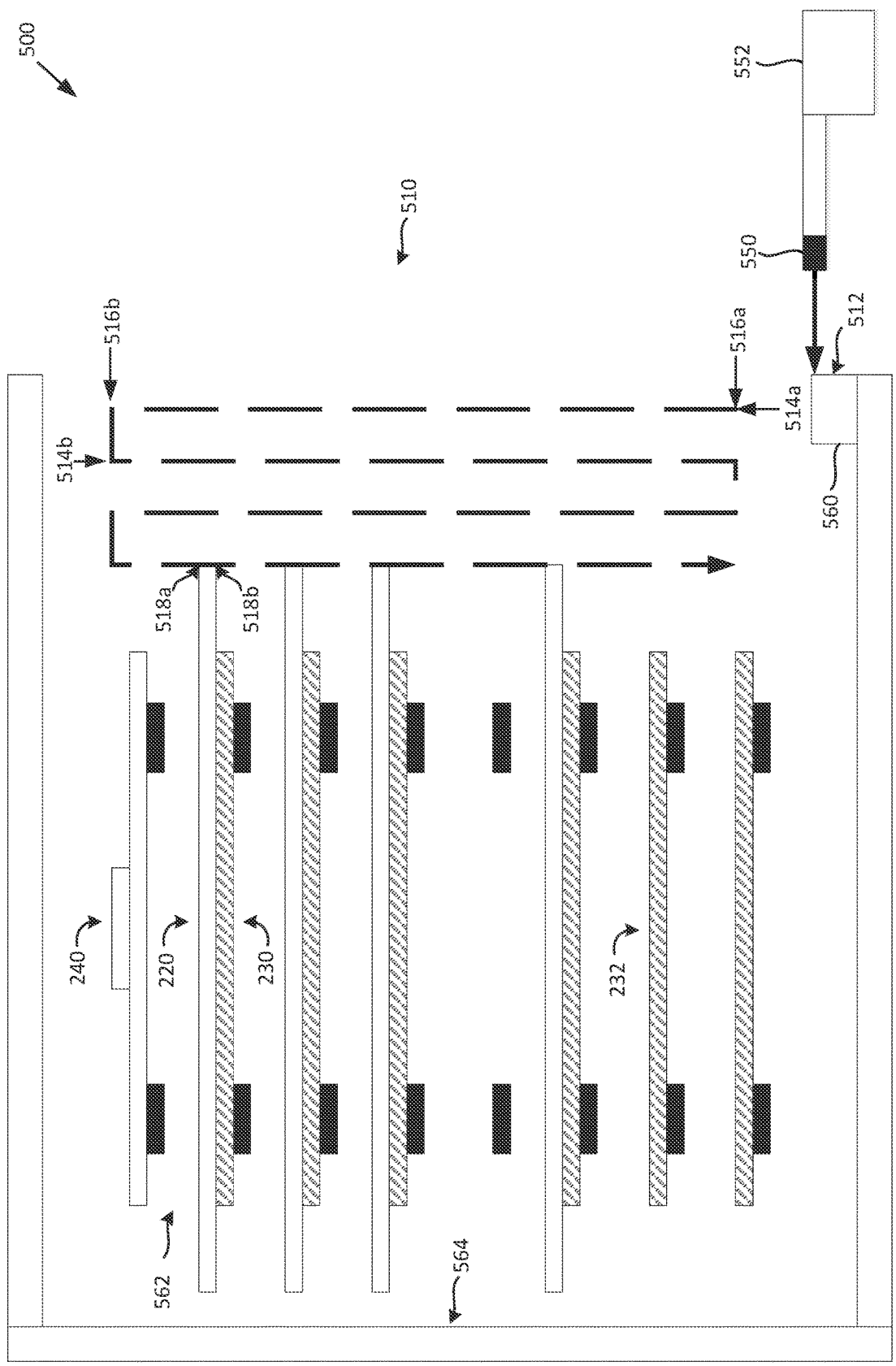
FIG. 5A illustrates a first mapping pattern to identify positions of replacement parts at a first portion of a replacement parts storage container, according to aspects of the present disclosure.

FIG. 5A illustrates a first mapping pattern 510 to identify positions of replacement parts at a first portion of a replacement parts storage container 500, according to aspects of the present disclosure. In some embodiments, replacement parts storage container 500 may be a replacement parts storage container (e.g., process kit enclosure system), such as replacement parts storage container described with respect to FIG. 2. Replacement parts storage container 500 may be received at a load port of a factory interface of an electronics processing system, in accordance with previously described embodiments. Replacement parts storage container 500 may be configured to store replacement parts 220 (e.g., process kit rings 220 of FIG. 2), replacement part carriers 230 with replacement parts 220 disposed on replacement part carriers 230, empty replacement part carriers 232, and/or wafers 240. In some embodiments, replacement parts storage container 500 may also include a registration feature 260 to enable identification of replacement parts storage container 500 as a process kit enclosure system.

A mapping of replacement parts storage container 500 may begin in response to replacement parts storage container 500 being received at a load port of a factory interface. As previously described herein, the mapping may be performed by a detection system 550 at a distal end of an end effector 552 of a robot arm (not shown) under the control of a system controller 128. In some embodiments, the robot arm may be a robot arm of a factory interface robot.

In response to replacement parts storage container 500 being received at a load port of the factory interface, it may be determined whether the replacement parts storage container 500 is configured to store replacement process kit rings. In some embodiments, an indication may be received that replacement parts storage container 500 is a process kit enclosure system. For example, a user (e.g., an operator of electronics processing system 100) may provide user input indicating that a replacement parts storage container 500 has been connected to a particular load port. In such embodiments, detection system 550 may be moved to a first portion of replacement parts storage container 500 to detect a registration identifier 560 indicating replacement parts storage container 500 is a process kit enclosure system. In other embodiments, an indication may not be received that replacement parts storage container 500 is a process kit enclosure system. In such embodiments, detection system 550 may detect registration identifier 560 in response to performing a first mapping pattern 510 (which may be part of a second container mapping recipe that is used to detect substrates in a substrate carrier system in some embodiments), in accordance with embodiments described herein.

Detection system 550 may be moved to a first position 512 of replacement parts storage container 500. At first position 512, detection system 550 may detect registration identifier 560. In response to detecting registration identifier 560, it may be determined that replacement parts storage container 500 is a process kit enclosure system. Additionally or alternatively, it may be determined that replacement parts storage container 500 is a process kit enclosure system based on one or more structural features on an exterior surface of replacement parts storage container 500, as previously described. As such, a first container mapping recipe may be performed. The first container mapping recipe may include a first mapping pattern (as illustrated with respect to FIG. 5A) and a second mapping pattern (as illustrated with respect to FIG. 5B). In response to not detecting registration identifier 560, it may be determined that replacement parts storage container 500 is not a process kit enclosure system. As such, a second container mapping recipe may be performed. The second container mapping recipe may include the first mapping pattern and may not include the second mapping pattern. The first mapping pattern may detect a section 562 (i.e., a slot) of replacement parts storage container 500 that includes replacement parts 220 and detect whether each replacement part 220 is properly stored at each detected section 562, in accordance with embodiments described herein.

As described above, in response to determining the replacement parts storage container 500 is a process kit enclosure system, a first mapping pattern 510 may be performed. Detection system 550 may be positioned at a first horizontal distance 514a from a portion of replacement parts storage container 500. In some embodiments, detection system 550 may be positioned at a first horizontal distance 514a from a back wall 564 or center of replacement parts storage container 500. Detection system 550 may be moved from a first height 516a to a second height 516b while detection system 550 is positioned at first horizontal distance 514a. As detection system 550 is moved from first height 516a to second height 516b, detection system 550 may determine whether an object of replacement parts storage container 500 extends to first horizontal distance 514a from the portion of the container. Detection system 550 may detect an object in accordance with embodiments described with respect to FIG. 4.

In response to determining an object extends to first horizontal distance 514a, it may be determined whether the object is a replacement part 220. As described with respect to FIG. 3, a replacement part may extend to first horizontal distance 514a, while an empty replacement part carrier 532 and/or a wafer 240 may not extend to first horizontal distance 514a because a diameter of a replacement part 220 may be larger than an empty replacement part carrier 352 and/or a wafer 240. In response to determining that the object is a replacement part 220, a section 562 (e.g., slot) of replacement parts container 500 that contains the replacement part 220 may be determined. The section 562 (i.e., a slot) that contains the replacement part 220 may be determined based on a vertical location of detection system 550 at the point in which the replacement part 220 is identified. The location may be associated with a particular section of replacement parts storage container 500. The location of detection system 550 may be detected by a z-encoder (not shown) of end effector 552, in accordance with embodiments described with respect to FIG. 4. Additionally, the horizontal distance may be determined based on an x,y position of the end effector, which may be determined by system controller 128.

In some embodiments, a top portion 518a and a bottom portion 518b of an object that extends to first horizontal distance 514a may be identified. A first location of top portion 518a and a second location of bottom portion 518b may be measured using detection system 550. The first location and the second location may be measured by a z-encoder a robot arm to which end effector 560 is attached, in accordance with previously described embodiments. An approximate thickness of the object may be determined based on the first location and the second location. Based on the determined approximate thickness of the object, it may be determined that the first object is a replacement part 220. For example, a replacement part 220 may have an expected thickness of between approximately 0.5 cm and approximately 2.0 cm. In response to determining that an approximate thickness of the object is approximately 1.0 cm, it may be determined that the object is a replacement part 220. Additionally, the amount that the object extends from the center or back 564 of the container may also be used to determine that the object is a replacement part 220. For example, replacement parts may have a known diameter and/or a known horizontal extension from the back or center of the container. In some embodiments, the x,y position of the end effector at which the object is detected as well as the detected thickness of the object are used together to determine an identify of the object.

In some embodiments, the determined approximate thickness may not indicate that the object that extends to first horizontal distance 514a is a replacement part 220. In accordance with the example above, the approximate thickness of the object may be approximately 3.0 cm, which does not correspond with the expected thickness of a replacement part 220. In other or additional embodiments, it may be determined that the object is not a replacement part 220 based on a determination that the first location of top portion 518a does not correspond to an expected first location of a replacement part 220 and/or the second location of bottom portion 518b does not correspond to an expected second location of a replacement part 220.

In some embodiments, it may be determined whether the object has been improperly placed at the section 562 of replacement parts storage container 500. In some embodiments, the determined approximate thickness may indicate that the object is a wafer 240 or an empty replacement part carrier 232, rather than a replacement part 220. It therefore may be determined a wafer or an empty replacement part carrier has erroneously moved in replacement parts storage container 500 so to extend to first horizontal distance 514a. In some embodiments, it may be determined that the determined approximate thickness does not correspond to a replacement part 220, a wafer 240 or an empty replacement part carrier 232. Instead, it may be determined that the determined approximate thickness of the object exceeds an expected thickness for each of a replacement part 220, a wafer 240 or an empty replacement part carrier 232. In such embodiments, the determined approximate thickness may indicate that the object is cross-slotted (i.e., a first portion of the object is in a first section 750 and a second portion of the object is in a second section 562 of replacement parts storage container 500).

In some embodiments, it may be determined that the first location of top portion 518a does not correspond to an expected first location of one or more detected replacement parts 220 and/or the second location of bottom portion 518b does not correspond to an expected second location of a replacement part 220. For example, a first location of a first detected replacement part 220 and a first location of a second detected replacement part 220 may be measured. A difference between the first location of a first detected replacement part 220 and the first location of a second detected replacement 220 part may be smaller than an expected height of a section 562 of replacement parts storage container 500. In such example, the difference between the first location of a first detected replacement part 220 and the first location of a second detected replacement 220 part may indicate that the first detected replacement part 220 and the second detected replacement part 220 are double-slotted. It may be similarly determined that the first detected replacement part 220 and the second detected replacement part 220 are double-slotted based on a different between the second location of the first detected replacement part 220 and the second location of the second detected replacement part 220.

In response to determining that the object that extends to the first horizontal distance 514a is not a replacement part 220, or the object has been improperly placed at the section 562 of replacement parts storage container 500, an error message may be transmitted to a controller (e.g., system controller 128) of the electronics processing system. The error message may indicate a defect at the section 562 of replacement parts storage container 500.

In performing first mapping pattern 510, it may be determined that no objects extend to first horizontal distance 514a. In such embodiments, detection system 550 may be positioned at a second horizontal distance 514b from the portion of the container. Second horizontal distance 514b may be less than first horizontal distance 514a. Detection system 550 may be moved from second height 516b to first height 516a while detection system 550 is positioned at second horizontal distance 514b. Detection system 550 may identify one or more objects that extend to second horizontal distance 514b. This process may continue, in which the distance between the end effector and the portion of the container is reduced by a fixed amount and then a vertical sweep is performed, until one or more objects are detected.

Figure 5B:
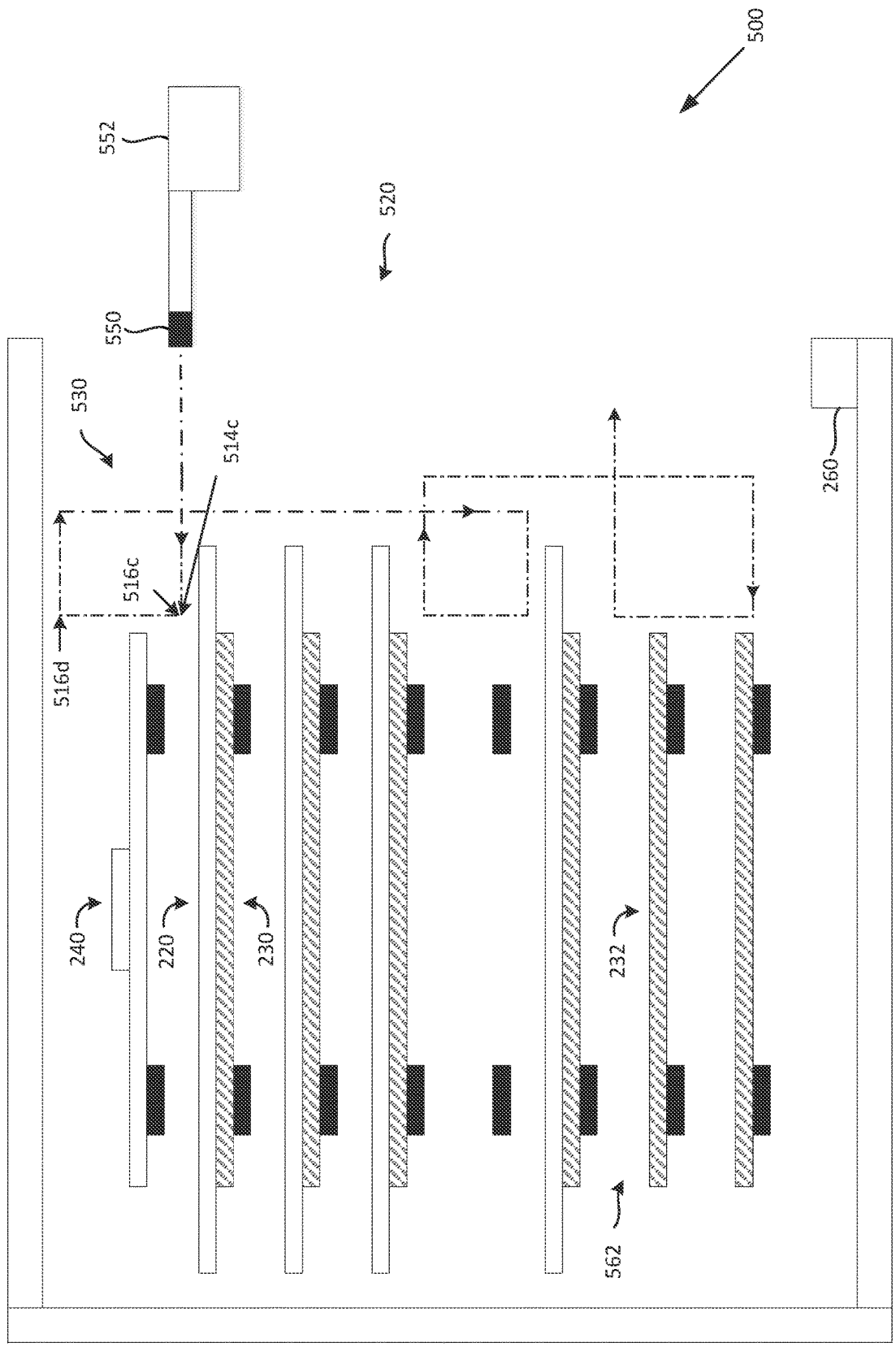
FIG. 5B illustrates a second mapping pattern to identify positions of a wafer or an empty carrier for a replacement part at a second portion of the replacement parts storage container, according to aspects of the present disclosure.

FIG. 5B illustrates a second mapping pattern to identify positions of a wafer or an empty carrier for a replacement part at a second portion of the replacement parts storage container 500, according to aspects of the present disclosure. In some embodiments, detection system 550 may determine, while performing first mapping pattern 510, one or more regions that do not contain replacement parts 220. In such embodiments, a robot arm may be moved according to a second mapping pattern 520 to identify, within the regions that do not contain replacement parts 220, a position of at least one wafer 240 and/or at least one empty replacement part carrier 232.

Detection system 550 may be positioned within a first region 530 within replacement parts storage container 500 that does not contain replacement parts 220. Detection system 550 may be positioned at a third horizontal distance 514c from the portion of replacement parts storage container 500, in accordance with previously described embodiments. In some embodiments, third horizontal distance 514c may be less than second horizontal distance 514b. Detection system 550 may be moved from a third height 516c within first region 530 to a fourth height 516d within first region 530, while detection system is positioned at the third horizontal distance 514c from the portion of the container. As detection system 550 moves from third height 516c to fourth height 516d within first region 530, detection system 550 may determine whether an object of replacement parts storage container 500 extends to third horizontal distance 514c. Detection system 550 may detect an object in accordance with embodiments described with respect to FIG. 4. In some embodiments, it may be determined whether an object extends third horizontal distance 514c at any height between third height 516c and fourth height 516d.

In response to determining an object extends to third horizontal distance 514c, it may be determined whether the object is a wafer 240 or an empty replacement part carrier 232. In some embodiments, it may be determined whether the object is a wafer 240 or an empty replacement part carrier 232 based on a determined approximate thickness of the object and/or horizontal extension from a back or center of the container, in accordance with previously described embodiments. In response to determining whether the object is a wafer or an empty replacement part carrier 232, the section 562 that contains the object may be determined based on a vertical location of detection system 550 at the point at which the object is identified. The location may be associated with a particular section 562 of replacement parts storage container 500. It may also be determined whether the object is properly stored in a section 562 in accordance with previously described embodiments.

In response to determining one or more objects that extend to third horizontal distance 514c of first region 530, second mapping pattern 520 may be performed at one or more additional regions determined to not include replacement parts 220, in accordance with previously described embodiments. In response to determining a presence and position of an object in each section 562 of replacement parts storage container 500, a mapping of each object of replacement parts storage container 500 may be generated and stored at a storage medium.

As described previously, first mapping process 510 and second mapping process 520 may be performed by a factory interface robot in response to replacement parts storage container 500 being received at a load port. In additional embodiments, first mapping process 510 and/or second mapping process 520 may be performed by a factory interface robot and/or a transfer chamber robot in response to replacement parts storage container 500 being received at any station of an electronics processing system.

In some embodiments, the load port may include an integrated mapping system that is configured to perform one or more mapping processes, such as first mapping process 510 and second mapping process 520. In such embodiments, a mapping of each object of replacement parts storage container 500 may be generated and stored at storage medium, in accordance with previously described embodiments. The factory interface robot and/or transfer chamber robot or electronics processing system 100 may retrieve replacement parts from, or place replacement parts at, replacement parts storage container 500 based on the mapping generated by the integrated mapping system at the load port.

Figure 6:
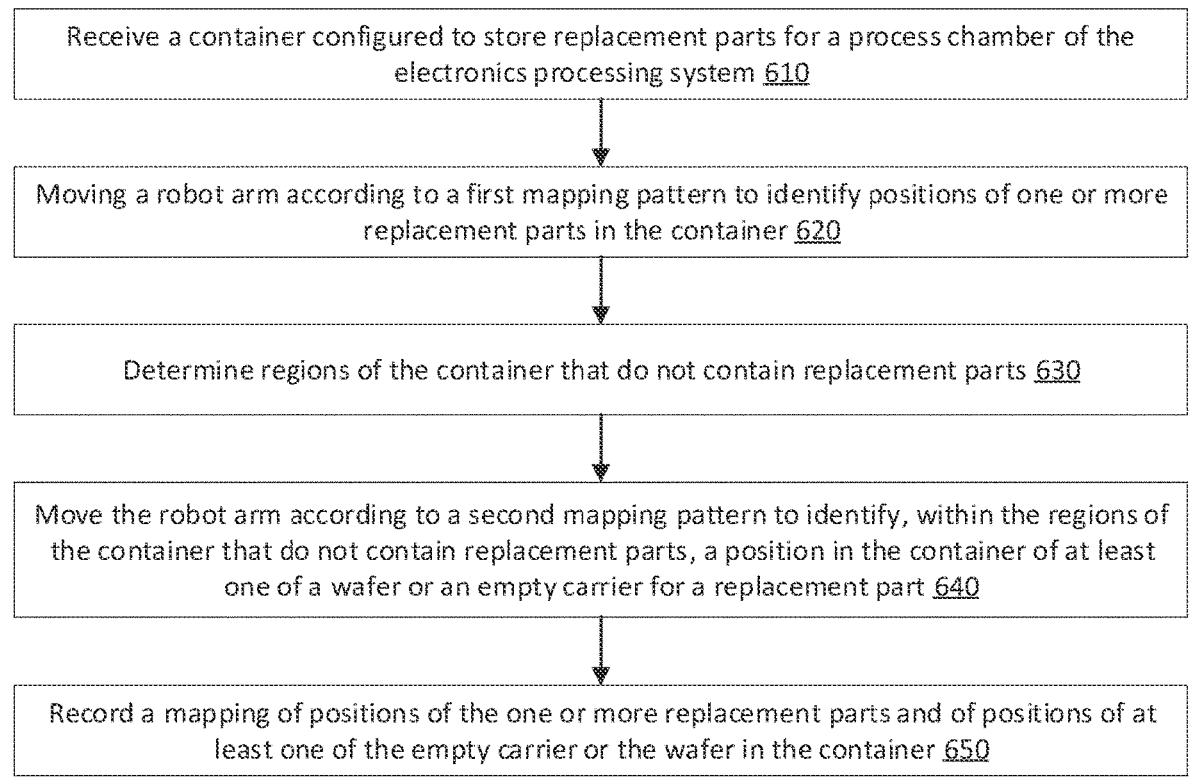
FIG. 6 is a flow chart of a method for detecting positions of replacement parts, wafers, or empty carriers for a replacement part stored at a replacement parts storage container, according to aspects of the present disclosure.
Figure 7:
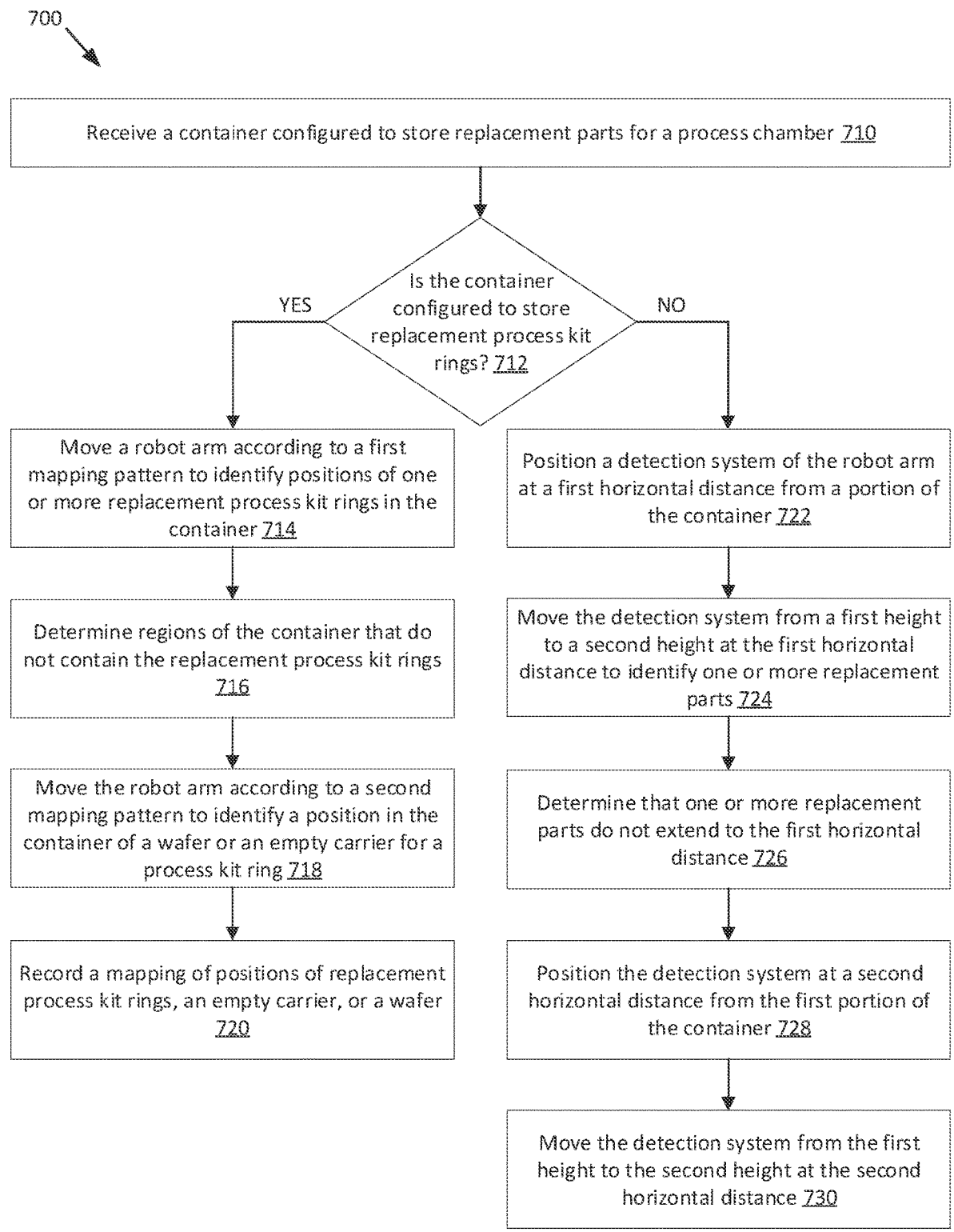
FIG. 7 is a flow chart of a method for determining whether a replacement parts storage container is configured to store replacement process kit rings, according to aspects of the present disclosure.

FIGS. 6-8 are flow diagrams of various embodiments of methods 600-800 for mapping a replacement parts storage container of an electronics processing system. The methods are performed by processing logic that may include hardware (circuitry, dedicated logic, etc.), software (such as is run on a general purpose computer system or a dedicated machine), firmware, or some combination thereof. Some methods 600-800 may be performed by a computing device, such as system controller 128 of FIG. 1 that is in control of a robot arm.

For simplicity of explanation, the methods are depicted and described as a series of acts. However, acts in accordance with this disclosure can occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

FIG. 6 is a flow chart of a method 600 for detecting positions of replacement parts, wafers, or empty carriers for a replacement part stored at a replacement parts storage container, according to aspects of the present disclosure. At block 610, a container is received at a load port of a factory interface of an electronics processing system. The container may be configured to store replacement parts for a process chamber of the electronics processing system. At block 620, a robot arm is moved according to a first mapping pattern to identify positions of one or more replacement parts in the container. A detection system at a distal end of an end effector of the robot arm is used to identify the positions. The detection system includes an emitting component and a sensing component. The detection system detects an object responsive to a beam directed from the emitting component to the sensing component being broken by the object. At block 630, regions of the container that do not contain replacement parts are determined. At block 640, the robot arm is moved according to a second mapping pattern to identify, within the regions of the container that do not contain replacement parts, a position in the container of a wafer or an empty carrier for a replacement part. The detection system at the distal end of the end effector may be used to identify the position. At block 650, a mapping of positions of the one or more replacement parts and of positions of at least one of the empty carrier or the wafer in the container.

FIG. 7 is a flow chart of a method 700 for determining whether a replacement parts storage container is configured to store replacement process kit rings, according to aspects of the present disclosure. At block 710, a container is received at a load port of a factory interface of an electronics processing system. The container may be configured to store replacement parts for a process chamber of the electronics processing system. At block 712, it may be determined whether the container is configured to store replacement process kit rings for the process chamber. A detection system at a distal end of an end effector of a robot arm may be used, where the detection system includes an emitting component and a sensing component. The detection system may detect an object in response to a beam directed from the emitting component to the sensing component being broken by the object. In response to determining that the container is configured to store replacement process kit rings, method 700 may continue to block 714. In response to determining that the container is not configured to store replacement process kit rings, method 700 may continue to block 722.

At block 714, the robot arm may be moved according to a first mapping pattern to identify, using the detection system at the distal end of the end effector, positions of one or more replacement process kit rings in the container. At block 716, regions of the container that do not contain the replacement process kit rings may be determined. At block 718, the robot arm may be moved according to a second mapping pattern to identify, using the detection system, a position in the container of a wafer or an empty carrier for a process kit ring. At block 720, a mapping of positions of replacement process kit rings, an empty carrier, or a wafer may be recorded. At block 722, a detection system of the robot arm is positioned at a first horizontal distance from a portion of the container. At block 724, the detection system is moved from a first height to a second height at the first horizontal distance to identify one or more replacement parts. At block 726, it may be determined that one or more replacement parts do not extend to the first horizontal distance. At block 728, the detection system may be positioned at a second horizontal distance from the first portion of the container. At block 730, the detection system may be moved from the first height to the second height at the second horizontal distance.

FIG. 8 is a flow chart of another method 800 for detecting positions of replacement parts, wafers, or empty carriers for a replacement part stored at a replacement parts storage container, according to aspects of the present disclosure. At block 810, a controller operatively coupled to a robot arm may determine that a container connected to a load port is configured to store replacement parts for a process chamber of the electronics processing system. At block 820, the controller will subsequently cause the robot arm to move according to a first mapping pattern to identify, using the detection system at the distal end of the end effector of the robot arm, positions in the container. At block 830, regions of the container that do not contain replacement parts are determined. At block 840, the controller causes the robot arm to move according to a second mapping pattern to identify, using the detection system at the distal end of the end effector, a position in the container of a wafer or a replacement part. At block 850, the controller records, in a storage medium, a mapping of positions of replacement parts and of positions of at least one of the empty carrier or the wafer in the container.

Figure 9:
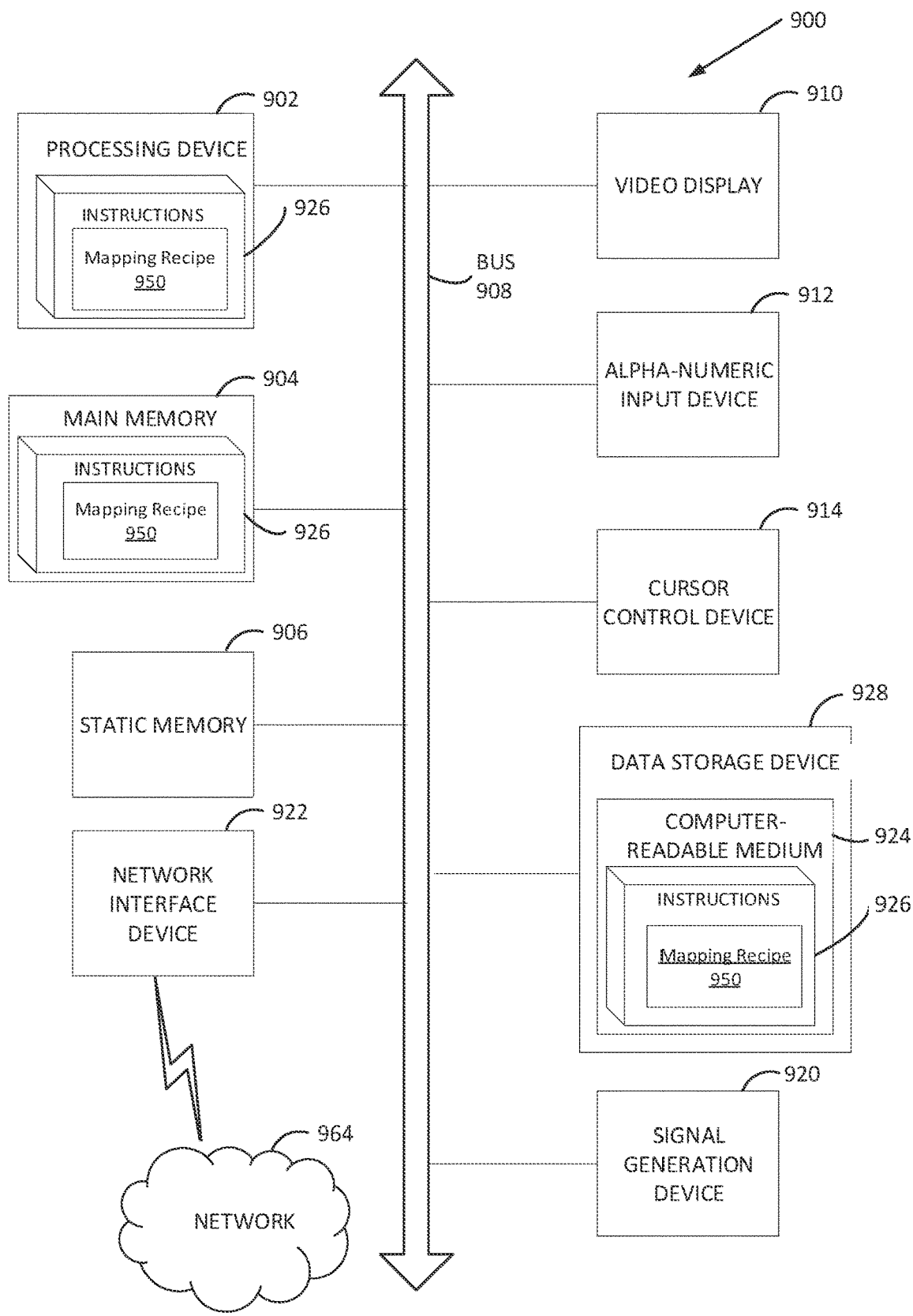
FIG. 9 illustrates a diagrammatic representation of a machine in the example form of a computing device within which a set of instructions, for causing the machine to perform any one or more of the methodologies discussed herein, may be executed.

FIG. 9 illustrates a diagrammatic representation of a machine in the example form of a computing device 900 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 900 may correspond to system controller 128 of FIG. 1.

The example computing device 900 includes a processing device 902, a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 928), which communicate with each other via a bus 908.

Processing device 902 may represent one or more general-purpose processors such as a microprocessor, central processing unit, or the like. More particularly, the processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. Processing device 902 may also be or include a system on a chip (SoC), programmable logic controller (PLC), or other type of processing device. Processing device 902 is configured to execute the processing logic (instructions 926 for mapping recipe 950) for performing operations and steps discussed herein.

The computing device 900 may further include a network interface device 922 for communicating with a network 964. The computing device 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 920 (e.g., a speaker).

The data storage device 928 may include a machine-readable storage medium (or more specifically a non-transitory computer-readable storage medium) 924 on which is stored one or more sets of instructions 926 embodying any one or more of the methodologies or functions described herein. Wherein a non-transitory storage medium refers to a storage medium other than a carrier wave. The instructions 926 may also reside, completely or at least partially, within the main memory 904 and/or within the processing device 902 during execution thereof by the computer device 900, the main memory 904 and the processing device 902 also constituting computer-readable storage media.

The computer-readable storage medium 924 may also be used to store a mapping recipe 950. The computer readable storage medium 924 may also store a software library containing methods that call mapping recipe 950. While the computer-readable storage medium 924 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An electronics processing system, comprising:
   a factory interface comprising a robot arm, wherein the robot arm comprises a detection system at a distal end of an end effector of the robot arm, and wherein the detection system comprises an emitting component and a sensing component, and wherein the detection system detects an object responsive to a beam directed from the emitting component to the sensing component being broken by the object;
   a load port connected to the factory interface;
   a container connected to the load port; and
   a controller operatively connected to the robot arm, wherein the controller is to:
      determine that the container is configured to store replacement parts for a process chamber of the electronics processing system;
      subsequently cause the robot arm to move according to a first mapping pattern to identify, using the detection system at the distal end of the end effector of the robot arm, a position in the container of one or more replacement parts;
      determine regions of the container that do not contain replacement parts;
      cause the robot arm to move according to a second mapping pattern to identify, using the detection system at the distal end of the end effector, a position in the container of at least one of a wafer or an empty carrier for a replacement part;
      record, in a storage medium, a mapping of the position of the one or more replacement parts and of the position of the at least one of the empty carrier or the wafer in the container; and
      based on the identified position of the one or more replacement parts and the identified position of the at least one of the wafer or the empty carrier for the replacement part:
         retrieve at least one of one or more replacement parts, the empty carrier, or the wafer from the container, or
         place at least one of one or more additional replacement parts, an additional empty carrier, or the wafer at one or more regions of the container.

2. The electronics processing system of claim 1, wherein the one or more replacement parts comprise process kit rings.

3. The electronics processing system of claim 1, wherein to cause the robot arm to move according to the first mapping pattern, the controller is to:
   cause the detection system to be positioned at a first horizontal distance from a portion of the container;
   cause the detection system to move from a first height to a second height while the detection system is positioned the first horizontal distance from the portion of the container to identify the one or more replacement parts in the container;
   determine whether the one or more replacement parts extend to the first horizontal distance from the portion of the container;
   responsive to determining that the one or more replacement parts do not extend to the first horizontal distance from the container, cause the detection system to be positioned at a second horizontal distance from the portion of the container, wherein the second horizontal distance is less than the first horizontal distance; and
   cause the detection system to move from the first height to the second height while the detection system is positioned the second horizontal distance from the portion of the container to identify the one or more replacement parts in the container.

4. The electronics processing system of claim 3, wherein to cause the robot arm to move according to the second mapping pattern, the controller is to:
   cause the detection system to be positioned within a first region of the container that does not contain replacement parts at a third horizontal distance from the portion of the container, wherein the third horizontal distance is less than the second horizontal distance; and
   cause the detection system to move from a third height within the first region to a fourth height within the first region while the detection system is positioned the third horizontal distance from the portion of the container, and wherein the controller is further to determine whether at least one of the empty carrier or the wafer extends to the third horizontal distance from the portion of the container at any height between the third height and the fourth height.

5. The electronics processing system of claim 1, wherein the controller is further to:
   identify, using the detection system, a first object comprising a top portion and a bottom portion placed at a first section of the container, wherein the first object extends into a first portion of the container;
   measure, using the detection system, a first location of the top portion of the first object and a second location of the bottom portion of the first object;
   determine, based on the first location and the second location, an approximate thickness of the first object;
   determine, based at least in part on the approximate thickness of the first object, that the first object comprises a replacement part for a process chamber; and
   record, in the storage medium, a position of the replacement part in the container.

6. The electronics processing system of claim 1, wherein the controller is further to:
   cause the robot arm to remove at least one of the one or more replacement parts, a wafer, or an empty carrier for a replacement part from the container in view of the recorded mapping of the position of the one or more replacement parts.

7. The electronics processing system of claim 1, wherein the controller is further to:
   cause the robot arm to place at least one of one or more additional replacement parts, an additional wafer, or an additional empty carrier at one or more regions of the container in view of the recorded mapping of the position of the one or more replacement parts.

8. An electronics processing system, comprising:
   a factory interface comprising a robot arm, wherein the robot arm comprises a detection system at a distal end of an end effector of the robot arm;
   a load port connected to the factory interface;
   a container connected to the load port; and
   a controller operatively connected to the robot arm, wherein the controller is to:
      cause the robot arm to move according to a first mapping pattern to identify, using the detection system, a position in the container of one or more replacement parts;
      determine regions of the container that do not contain replacement parts;
      cause the robot arm to move according to a second mapping pattern to identify, using the detection system, a position in the container of at least one of a wafer or an empty carrier for a replacement part;
      record, in a storage medium, a mapping of the position of the one or more replacement parts and of the position of the at least one of the empty carrier or the wafer in the container; and
      based on the identified position of the one or more replacement parts and the identified position of the at least one of the wafer or the empty carrier for the replacement part:
         retrieve at least one of the one or more replacement parts, the empty carrier, or the wafer from the container, or
         place at least one of one or more additional replacement parts, an additional empty carrier, or the wafer at one or more regions of the container.

9. The electronics processing system of claim 8, wherein the detection system at the distal end of the end effector of the robot arm comprises an emitting component and a sensing component, and wherein the detection system detects an object responsive to a beam directed from the emitting component to the sensing component being broken by the object.

10. The electronics processing system of claim 8, wherein the one or more replacement parts comprise process kit rings.

11. The electronics processing system of claim 8, wherein to cause the robot arm to move according to the first mapping pattern, the controller is to:
   cause the detection system to be positioned at a first horizontal distance from a portion of the container;
   cause the detection system to move from a first height to a second height while the detection system is positioned the first horizontal distance from the portion of the container to identify the one or more replacement parts in the container;
   determine whether the one or more replacement parts extend to the first horizontal distance from the portion of the container;
   responsive to determining that the one or more replacement parts do not extend to the first horizontal distance from the container, cause the detection system to be positioned at a second horizontal distance from the portion of the container, wherein the second horizontal distance is less than the first horizontal distance; and
   cause the detection system to move from the first height to the second height while the detection system is positioned the second horizontal distance from the portion of the container to identify the one or more replacement parts in the container.

12. The electronics processing system of claim 11, wherein to cause the robot arm to move according to the second mapping pattern, the controller is to:
   cause the detection system to be positioned within a first region of the container that does not contain replacement parts at a third horizontal distance from the portion of the container, wherein the third horizontal distance is less than the second horizontal distance; and
   cause the detection system to move from a third height within the first region to a fourth height within the first region while the detection system is positioned the third horizontal distance from the portion of the container,
   and wherein the controller is further to determine whether at least one of the empty carrier or the wafer extends to the third horizontal distance from the portion of the container at any height between the third height and the fourth height.

13. The electronics processing system of claim 8, wherein the controller is further to;
   identify, using the detection system, a first object comprising a top portion and a bottom portion placed at a first section of the container, wherein the first object extends into a first portion of the container;
   measure, using the detection system, a first location of the top portion of the first object and a second location of the bottom portion of the first object;
   determine, based on the first location and the second location, an approximate thickness of the first object;
   determine, based at least in part on the approximate thickness of the first object, that the first object comprises a replacement part for a process chamber; and
   record, in a storage medium, a position of the replacement part in the container.

14. The electronics processing system of claim 8, wherein the controller is further to:

record, in a storage medium, a mapping of positions of the one or more replacement parts and of positions of at least one of the empty carrier or the wafer in the container.

15. The electronics processing system of claim 8, wherein to determine whether the container connected to the load port is configured to store replacement parts for a process chamber, the controller is to:
receive a notification indicating that that the container is a replacement part container.

16. An electronics processing system, comprising:
a factory interface comprising a robot arm, wherein the robot arm comprises a detection system at a distal end of an end effector of the robot arm, and wherein the detection system comprises an emitting component and a sensing component, and wherein the detection system detects an object responsive to a beam directed from the emitting component to the sensing component being broken by the object;
a load port connected to the factory interface, wherein the load port is configured to receive a container; and
a controller operatively connected to the robot arm, wherein the controller is to:
detect that a container is received at the load port;
determine, using the detection system at the distal end of the end effector of the robot arm, whether the container is configured to store replacement parts for a process chamber;
responsive to determining that the container is configured to store the replacement parts for the process chamber, perform a first container mapping recipe comprising:
causing the robot arm to be moved according to a first mapping pattern to identify, using the detection system at the distal end of the end effector, a position in the container of one or more replacement parts;
determining regions of the container that do not contain the replacement parts;
causing the robot arm to be moved according to a second mapping pattern to identify, using the detection system, a position in the container of at least one of a wafer or an empty carrier for a process kit ring;
recording, in a storage medium, a mapping of the position of the one or more replacement parts and of the position of the at least one of the empty carrier or the wafer in the container; and
based on the identified positions of the one or more replacement parts and the identified position of the at least one of the wafer or the empty carrier for the process kit ring:
retrieve at least one of one or more replacement parts, the empty carrier, or the wafer from the container, or
place at least one of one or more additional replacement parts, an additional empty carrier, or the wafer at one or more regions of the container.

17. The electronics processing system of claim 16, wherein causing the robot arm to be moved according to the first mapping pattern comprises:
positioning the detection system a first horizontal distance from a portion of the container;
moving the detection system from a first height to a second height while the detection system is positioned the first horizontal distance from the portion of the container to identify the one or more replacement parts in the container;
determining whether the one or more replacement parts extend to the first horizontal distance from the portion of the container;
responsive to determining that the one or more replacement parts do not extend to the first horizontal distance from the container, positioning the detection system a second horizontal distance from the portion of the container, wherein the second horizontal distance is less than the first horizontal distance; and
moving the detection system from the first height to the second height while the detection system is positioned the second horizontal distance from the portion of the container to identify the one or more replacement parts in the container.

18. The electronics processing system of claim 17, wherein:
moving the robot arm according to the second mapping pattern comprises:
positioning the detection system within a first region of the container that does not contain replacement parts at a third horizontal distance from the portion of the container, wherein the third horizontal distance is less than the second horizontal distance; and
moving the detection system from a third height within the first region to a fourth height within the first region while the detection system is positioned the third horizontal distance from the portion of the container,
and wherein the controller is further to determine whether at least one of the empty carrier or the wafer extends to the third horizontal distance from the portion of the container at any height between the third height and the fourth height.

19. The electronics processing system of claim 16, wherein the controller is further to:
identify, using the detection system, a first object comprising a top portion and a bottom portion placed at a first section of the container, wherein the first object extends into a first portion of the container;
measure, using the detection system, a first location of the top portion of the first object and a second location of the bottom portion of the first object;
determine, based on the first location and the second location, an approximate thickness of the first object;
determine, based at least in part on the approximate thickness of the first object, that the first object comprises a replacement part for a process chamber; and
record, in a storage medium, a position of the replacement part in the container.

20. The electronics processing system of claim 16, wherein to determine whether the container is configured to store replacement parts for the process chamber, the controller is to:
cause the robot arm to be moved to a first portion of the container to detect an identifier component that indicates the container is a process kit ring container;
determine whether the container comprises the identifier component; and
responsive to determining that the container comprises the identifier component, proceed with moving the robot arm according to the first mapping pattern.

* * * * *